United States Patent [19]

Chi

[11] Patent Number: 5,539,228
[45] Date of Patent: Jul. 23, 1996

[54] FIELD-EFFECT TRANSISTOR WITH HIGH BREAKDOWN VOLTAGE PROVIDED BY CHANNEL RECESS OFFSET TOWARD DRAIN

[75] Inventor: Tom Y. Chi, San Gabriel, Calif.

[73] Assignee: Hughes Aircraft Company, Los Angeles, Calif.

[21] Appl. No.: 385,386

[22] Filed: Feb. 7, 1995

Related U.S. Application Data

[63] Continuation of Ser. No. 144,097, Oct. 28, 1993, abandoned, which is a continuation of Ser. No. 920,939, Jul. 28, 1992, abandoned.

[51] Int. Cl.$^6$ .......................... H01L 29/80; H01L 31/112
[52] U.S. Cl. .......................... 257/283; 257/282; 257/284; 257/275; 257/286
[58] Field of Search .................... 357/22 R, 15, 357/22 H, 22 I, 22 K, 22 J, 55; 257/256, 268, 275, 286, 622, 280, 281, 282, 283, 284

[56] References Cited

U.S. PATENT DOCUMENTS

| | | | |
|---|---|---|---|
| 4,135,168 | 1/1979 | Wade | 331/108 |
| 4,972,237 | 11/1990 | Kawai | 357/15 |

FOREIGN PATENT DOCUMENTS

| | | | |
|---|---|---|---|
| 1-51666 | 2/1989 | Japan | 357/22 |

OTHER PUBLICATIONS

"Gallium Arsenide Processing Techniques", by R. Wiliams, Artech House, 1984, pp. 61–71.
"A 2.5 Watt X–Band High Efficiency MMIC Amplifier", by V. Hwang et al., IEEE 1990 Microwave and Millimeter-–Wave Monolithic Circuits Sym, pp. 39–41.
"Surface Potential Effect On Gate–Drain Avalanche Breakdown In GaAs MESFET'S", by H. Mizuta, IEEE, vol. ED–34, No. 10, Oct. 1987, pp. 2027–2033.

*Primary Examiner*—Ngân V. Ngô
*Attorney, Agent, or Firm*—M. E. Lachman; M. W. Sales; W. K. Denson-Low

[57] ABSTRACT

A monolithic-microwave-integrated-circuit (MMIC) metal-semiconductor-field-effect (MESFET) transistor (40) or other type of field-effect transistor has a double-recessed channel region (32,42) with a gate recess (42) formed in a channel recess (32). The channel recess (32) is offset toward the drain (16) as far as possible without shorting the channel recess (32) to the drain (16) to increase the transistor breakdown voltage. The gate recess (42) is offset toward the source (14) as far as possible without causing the gate-source capacitance to increase, thereby reducing the transistor source resistance.

4 Claims, 1 Drawing Sheet

FIELD-EFFECT TRANSISTOR WITH HIGH BREAKDOWN VOLTAGE PROVIDED BY CHANNEL RECESS OFFSET TOWARD DRAIN

This is a continuation application Ser. No. 08/144,097, filed Oct. 28, 1993, now abandoned, which is a continuation application Ser. No. 07/920,939, filed Jul. 28, 1992, now abandoned.

BACKGROUND OF THE INVENTION

1. Field of the Invention

The present invention generally relates to dual-recessed gate field-effect transistors (FETs), especially monolithic-microwave-integrated-circuit (MMIC) metal-semiconductor field-effect transistors (MESFETs) fabricated on semi-insulating gallium arsenide (GaAs) substrates, with high breakdown voltages provided by offsetting the channel recesses toward the drains of the transistors.

2. Description of the Related Art

A MESFET includes a source and drain formed in a semiconductor substrate, and an active channel region formed in the substrate between the source and drain. A metal gate is formed over the channel region for controlling current flow therethrough in accordance with a voltage applied to the gate.

In order to reduce the source and drain parasitic resistances, a recess is commonly formed in the channel region, and the gate is formed in the recess. The performance of the MESFET can be further enhanced by providing a dual-recessed gate configuration, including a gate recess formed in the channel recess, to enhance the ability of the depletion region under the gate to modulate the channel current under negative gate bias.

A conventional dual-recessed gate MMIC MESFET 10 is illustrated in FIG. 1. The basic design of the MESFET 10 is described in a textbook entitled "GALLIUM ARSENIDE PROCESSING TECHNIQUES", by R. Williams, Artech House, 1984, pp. 61–71. The MESFET 10 is a unit cell which can be fabricated in parallel with a plurality of similar MESFETs in a MMIC circuit configuration to provide a high power MMIC amplifier. Such an arrangement is disclosed in an article entitled "A 2.5 WATT X-BAND HIGH EFFICIENCY MMIC AMPLIFIER", by V Hwang et al, IEEE 1990 Microwave and Millimeter-Wave Monolithic Circuits Symposium, pp. 39–41.

The MESFET 10 includes a semi-insulating semiconductor substrate 12, typically in the form of a GaAs wafer. A heavily doped N-type source 14 and drain 16 are formed in the substrate 12. A lightly doped N-type active channel region 18 is formed in the substrate 12 between the source 14 and drain 16.

A channel recess 20 is formed in the surface of the channel region 18, and a gate recess 20 is formed in the surface of the channel recess 20 to provide a dual-recess configuration. A metal gate 24 is formed in the gate recess 22 to form a Schottky barrier with the underlying portion of the channel region 18. An ohmic source pad 26 is formed on the source 14, and a similar pad 28 is formed on the drain 16.

In the conventional MESFET 10, the channel recess 20 is centered between the source 14 and drain 16, the gate recess 22 is centered in the channel recess 20 and the gate 24 is centered in the gate recess 22. The length and depth of the channel recess 20 and gate recess 22 involve design tradeoffs between parasitic resistance, feedback capacitance, breakdown voltage and other parameters, and are determined empirically for a particular design.

Breakdown voltage is one of the most important parameters in the design of FETs for MMIC power amplifiers. The configuration of FIG. 1 has a breakdown voltage of approximately 12 to 15 volts. The recessed gate configuration increases the breakdown voltage as discussed in an article entitled "Surface Potential Effect on Gate-Drain Avalanche Breakdown in GaAs MESFET's", by H Mizuta, in IEEE Transactions on Electron Devices, Vol. ED-34, No. 10, Oct. 1987, pp. 2027–2033.

Operation at higher voltages enables the power handling capability and efficiency of an FET to be increased. However, higher voltage operation has been limited by the relatively low breakdown voltage of the conventional MESFET design.

SUMMARY OF THE INVENTION

The present invention provides a field-effect transistor, preferably embodied as a MMIC MESFET, which has a higher breakdown voltage, typically on the order of 20 to 25 volts or more, than a conventional MESFET such as illustrated in FIG. 1. The present FET is capable of operating with improved performance, especially higher power and efficiency, than transistors with previously known configurations.

More specifically, a MMIC MESFET embodying the invention has a double-recessed channel region with a gate recess formed in a channel recess. The channel recess is offset toward the drain as far as possible without shorting the channel recess to the drain to increase the transistor breakdown voltage. The gate recess is offset toward the source as far as possible without causing the gate-source capacitance to increase significantly, thereby reducing the transistor source resistance.

Although the present transistor is especially suited for embodiment as a MMIC MESFET, the principles of the invention can be applied to other types of FETs, such as metal-oxide-semiconductor field-effect transistors (MOSFETs).

In the more general context, a field-effect transistor embodying the invention includes a semiconductor substrate, a source and a drain formed in the substrate and a channel region formed in the substrate between the source and the drain. A channel recess is formed in the channel region having a first end spaced from the source by a first predetermined distance and a second end spaced from the drain by a second predetermined distance which is smaller than the first predetermined distance. A gate is formed in the channel recess.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
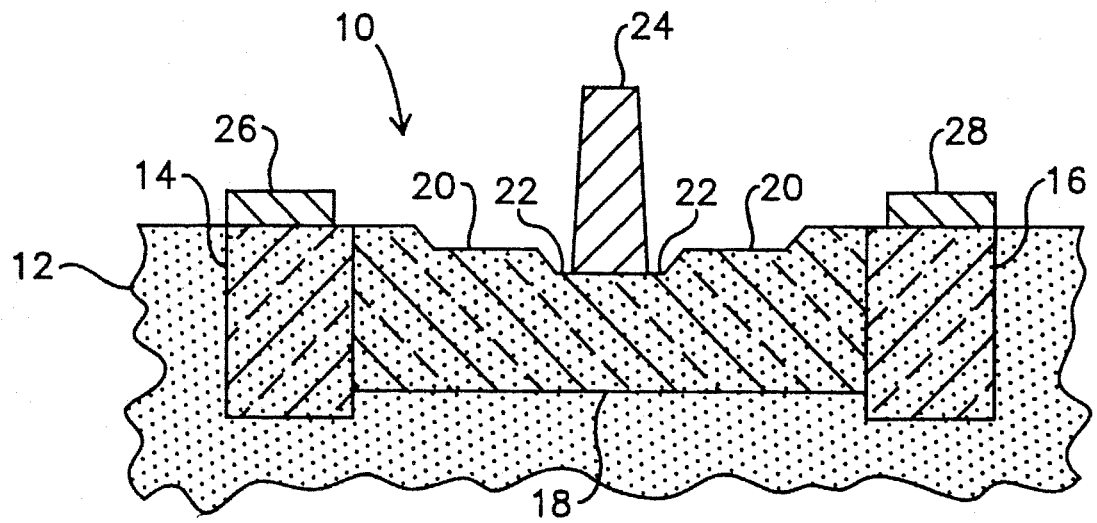
FIG. 1 is a simplified sectional view illustrating a prior art MESFET.
Figure 2:
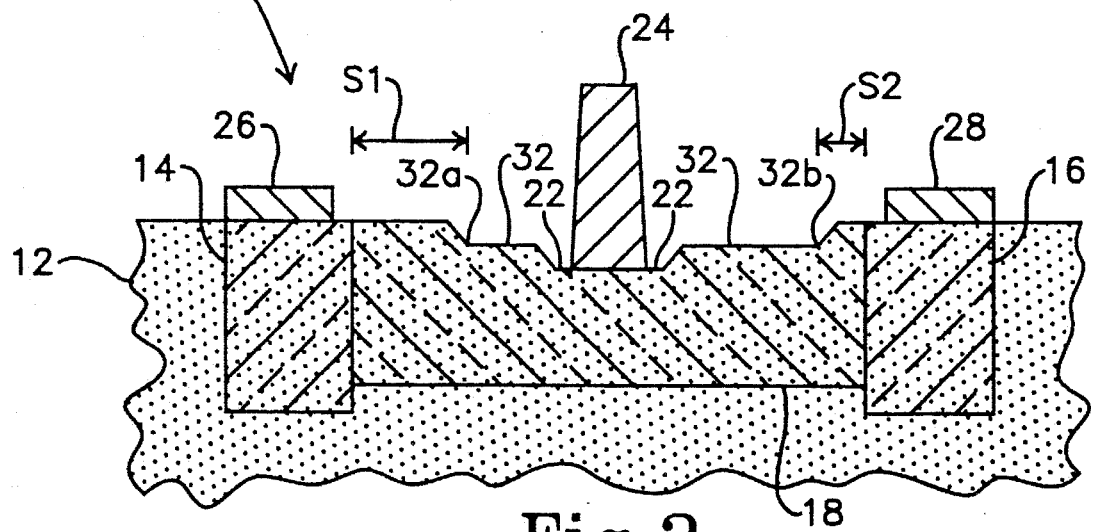
FIG. 2 is a simplified sectional view illustrating a MESFET embodying the present invention.

A MMIC MESFET 30 embodying the present invention is illustrated in FIG. 2, with like elements being designated by the same reference numerals used in FIG. 1. The gate recess 22 is centered between the source 14 and drain 16 as in the MESFET 10. However, the channel recess 20 of the conventional MESFET 10 is replaced by a channel recess 32 having a first end 32a which is spaced from the source 14 by a first predetermined distance S1, and a second end 32b which is spaced from the drain 16 by a second predetermined distance S2, with S2 being smaller than S1.

The breakdown voltage of the MESFET 30 depends on the volume of doped material in the channel region 18 between the gate 24 and drain 16. The greater the volume of doped material, the lower the breakdown voltage. Offsetting the channel recess 32 toward the drain 16 reduces the volume of doped material between the gate 24 and the drain 16, since the cross-sectional area of the channel region 18 in the channel recess 32 is smaller than the cross-sectional area of the channel region 18 outside the channel recess 32.

The maximum breakdown voltage is attained with the distance S2 at a minimum predetermined value $S2_{min}$ below which the channel recess 32 will be effectively shorted to the drain 16. The value $S2_{min}$ must be determined empirically for each particular design. In accordance with the principles of the invention, the distance S2 is made as close to $S2_{min}$ as is practical within the limits of the technology used to fabricate the MESFET 30.

In actual practice, a tolerance factor must be included to compensate for the margin of error inherent in the processing technology. Assuming that the maximum deviation of the distance S2 due to processing tolerances is $\Delta S2$, the value of S2 which is set into the processing apparatus is ($S2_{min}+\Delta S2/2$). For the purposes of the invention, the preferred value of S2 is considered to be substantially equal to $S2_{min}$, ranging from approximately $S2_{min}$ to approximately ($S2_{min}+\Delta S2$).

Figure 3:
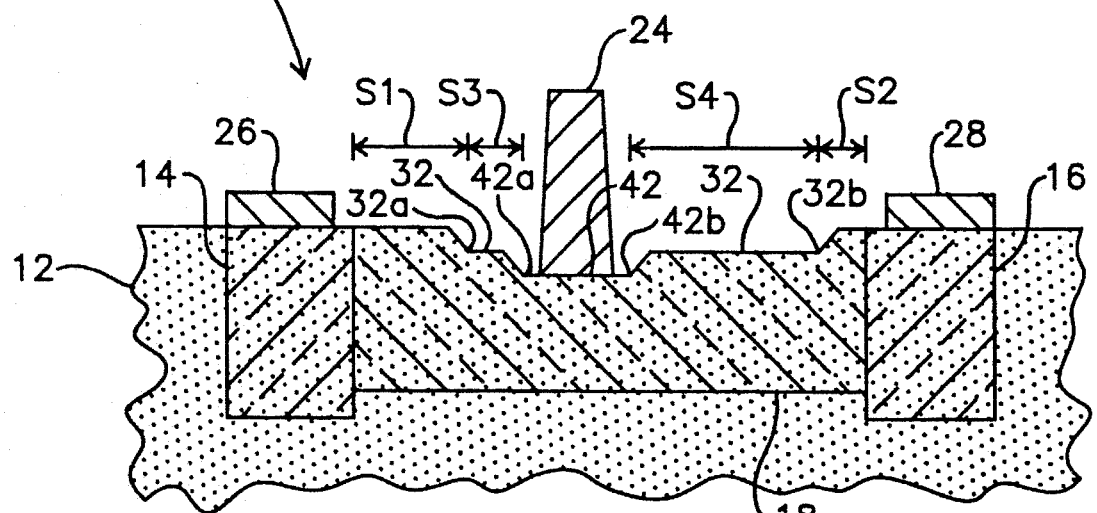
FIG. 3 is similar to FIG. 2, but illustrates another MESFET embodying the invention.

FIG. 3 illustrates another MESFET 40 embodying the present invention. The ends 32a and 32b of the channel recess 32 are offset from the source 14 and drain 16 by the distances S1 and S2 respectively in the same manner as illustrated in FIG. 2. However, the gate recess 22 is replaced by a gate recess 42 which is offset toward the source 14. The gate 24 is centered in the gate recess 42. This produces a further improvement by reducing the source resistance of the MESFET 40.

The source resistance depends on the distance between the source 14 and gate 24. The larger the distance, the larger the source resistance. Offsetting the gate recess 42 toward the source 14 thereby reduces the source resistance. More specifically, the end 32a of the channel recess 32 is spaced from an end 42a of the gate recess 42 by a third predetermined distance S3, and the end 32b of the channel recess 32 is spaced from an end 42b of the gate recess 42 by a distance S4, with S3 being smaller than S4.

The distance S3 is preferably equal to a predetermined minimum value $S3_{min}$ below which the capacitance between the source 14 and gate 24 would increase to an unacceptable extent. In the manner described above with respect to the distance S2, the distance S3 is substantially equal to $S3_{min}$ within the tolerance limitations of the processing technology.

The process for fabricating the present MESFETs 30 and 40 is not the particular subject matter of the present invention, and will not be described in detail. The process for fabricating the prior art MESFET 10 is described in the above referenced textbook to Williams on pages 272–278. Generally, the source 14, drain 16 and active area 18 are formed in the substrate 12 by ion implantation, and the channel recess 32 and gate recess 22 or 42 are formed by lithography and wet etching. The same process or any other suitable process can be used to fabricate the MESFETs 30 and 40.

EXAMPLE

A set of thirty MESFETs 40 as illustrated in FIG. 3 was fabricated, having a channel length $S_c$ (distance between the source 14 and drain 16) of 4 micrometers. The width of the gate 24 (and substantially the gate recess 42) was 0.6 micrometers. The length of the channel recess 32 was ($S_c$–S1–S2)=2.4 micrometers. S1 was 1.0 micrometers, S2 was 0.5 micrometers, S3 was 0.5 micrometers and S4 was 1.4 micrometers. The thirty MESFETs 40 as tested had breakdown voltages of approximately 20 to 25 volts, measured at a current density of 1 milliampere per millimeter.

A field-effect transistor embodying the present invention is capable of operating with improved performance, especially higher power and efficiency, than transistors with previously known configurations. Although the present FET is especially suited for embodiment as a MMIC MESFET, the principles of the invention can be applied to other types of FETs, such as metal-oxide-semiconductor field-effect transistors (MOSFETs).

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A metal semiconductor field-effect transistor comprising:

(a) a semiconductor substrate;

(b) a source and a drain each formed in said substrate;

(c) a channel region formed in said substrate between said source and said drain;

(d) a channel recess formed in said channel region and having a first end closer to said source and a second end closer to said drain, wherein a distance between said second end of said channel recess and said drain is less than a distance between said first end of said channel recess and said source and said distance between said second end of said channel recess and said drain is a predetermined distance having a value below which electrical shorting of said channel recess to said drain would occur;

(e) a gate recess formed entirely within said channel recess such that a depth of said gate recess is greater than a depth of said channel recess, said gate recess having a first end closer to said source and a second end closer to said drain wherein a distance between said first end of said gate recess and said source is less than a distance between said second end of said gate recess and said drain; and (f) a gate formed in said gate recess.

2. The metal semiconductor field-effect transistor of claim 1 wherein said substrate comprises gallium arsenide.

3. A metal semiconductor field effect transistor as in claim 1, in which the gate is substantially centered in the gate recess.

4. The metal semiconductor field effect transistor as in claim 1, in which a distance between said gate recess and said first end of said channel recess is substantially a predetermined value below which the capacitance between said gate and said source would increase.

* * * * *